(12) United States Patent
Reid

(10) Patent No.: US 7,321,238 B1
(45) Date of Patent: Jan. 22, 2008

(54) OVER-VOLTAGE TOLERANT MULTIFUNCTION INPUT STAGE

(75) Inventor: David Reid, Sydney (AU)

(73) Assignee: Integrated Device Technology, Inc., San Jose, CA (US)

( * ) Notice: Subject to any disclaimer, the term of this patent is extended or adjusted under 35 U.S.C. 154(b) by 82 days.

(21) Appl. No.: 11/317,066

(22) Filed: Dec. 22, 2005

(51) Int. Cl.
*H03K 19/0175* (2006.01)

(52) U.S. Cl. .......................... 326/81; 326/23
(58) Field of Classification Search ............ 326/22, 326/23, 24, 25, 80, 81; 327/319
See application file for complete search history.

(56) References Cited

U.S. PATENT DOCUMENTS 5,914,844 A   6/1999  Lutley et al.
6,049,242 A   4/2000  Lutley et al.
6,150,845 A * 11/2000  Morrill ....................... 326/81
7,199,614 B2 * 4/2007  Dover et al. ................ 326/81

* cited by examiner

*Primary Examiner*—Daniel D. Chang
(74) *Attorney, Agent, or Firm*—Glass & Associates; Michael R. Hardaway; Kenneth Glass

(57) ABSTRACT

An over-voltage tolerant input stage in a semiconductor device is disclosed. The input stage includes: an input pad for receiving an input signal to the semiconductor device, a buffer coupled to the input pad for buffering the input signal, a pullup circuit for limiting current in the input signal, a switching circuit coupled to the input pad for controlling the pullup circuit, and a voltage supply coupled to the input pad, the pullup circuit and the switching circuit. In operation, the switching circuit is enabled to cause the pullup circuit to stop current flow between the input signal and voltage supply in the event of an over-voltage condition.

16 Claims, 5 Drawing Sheets

OVER-VOLTAGE TOLERANT MULTIFUNCTION INPUT STAGE

BACKGROUND OF THE INVENTION

The speed and capability of electronic appliances continues to increase proportionally with the reduction in their sizes. Cellular phones, for example, continue to supply ever more utility in an ever smaller form factor. The "real estate" inside such equipment gets more crowded and, not surprisingly, more valuable. As a result, ways have to be found to reduce chip footprint in an electronic device.

One way to reduce footprint size is to reduce the number of connections of an individual semiconductor chip. However, the increasing complexity desired by manufacturers and designers works against reducing the input and output connections of a semiconductor chip.

Another way of limiting the number of required connections in a chip, without reducing the chip's capabilities and complexities, is to put more than one function on a given connection pin. One example of this is putting a seldom-used command input on the same pin as a data input. One implementation could be putting a re-program enable (RPE) for an EEPROM device on the same pin as a data line. The device itself can distinguish between data and RPE inputs because data inputs are between ground (0.0 Volts) and supply voltage but RPE inputs are higher, on the order of 12 volts. Supply voltage in modern devices can be as low as 1.8 volts, or even lower.

However, a device configured to operate in a low voltage environment, such as 1.8 volts, is likely to be damaged when hit with an input of 12 volts, such as is commonly used for re-program enables, or other special command inputs. Command inputs or other special functions, it is noted, cannot be handled by electro-static discharge protections because they need to be processed as commands.

Accordingly, there is a need for accommodating a multifunction input to a semiconductor chip that is tolerant to a high voltage input on the same input pad that responds to logic level voltages. The high voltage input must not overpower the much smaller logic level voltages attendant to normal functions of the device, such as data handling or supply voltage.

SUMMARY OF THE INVENTION

The present invention provides a circuit and method for accommodating a multifunction input to a semiconductor chip that is tolerant to a high voltage input, on the same input pad that responds to logic level voltages. Relatively small logic level voltages attendant to normal functions of the device, such as data handling or supply voltage, are not overpowered by the relatively high current of the high voltage input.

A novel over-voltage tolerant input stage in a semiconductor device is disclosed. The input stage comprises: an input pad for receiving an input signal to the semiconductor device, a buffer coupled to the input pad for buffering the input signal, a pullup circuit coupled to the input pad, a switching circuit coupled to the input pad for controlling the pullup circuit, and a voltage supply coupled to the input pad, the pullup circuit and the switching circuit, wherein the switching circuit is enabled to cause the pullup circuit to stop current flow between the input signal and the voltage supply in the event of an over-voltage condition. By accommodating high voltage inputs, the input stage is useful for accomplishing multiple functions in a semiconductor device.

These and other objects and advantages of the present invention will become obvious to those of ordinary skill in the art after having read the following detailed description of the preferred embodiments that are illustrated in the various drawing figures.

DETAILED DESCRIPTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it should be understood by one of ordinary skill in the art that the present invention may be practiced without these specific details. In other instances, well-known methods, procedures, components, and circuits have not been described in detail so as not to unnecessarily obscure aspects of the present invention. At times, concepts disclosed in this discussion of embodiments of the present invention will be made more readily apparent by reference to the Figures.

Figure 1:
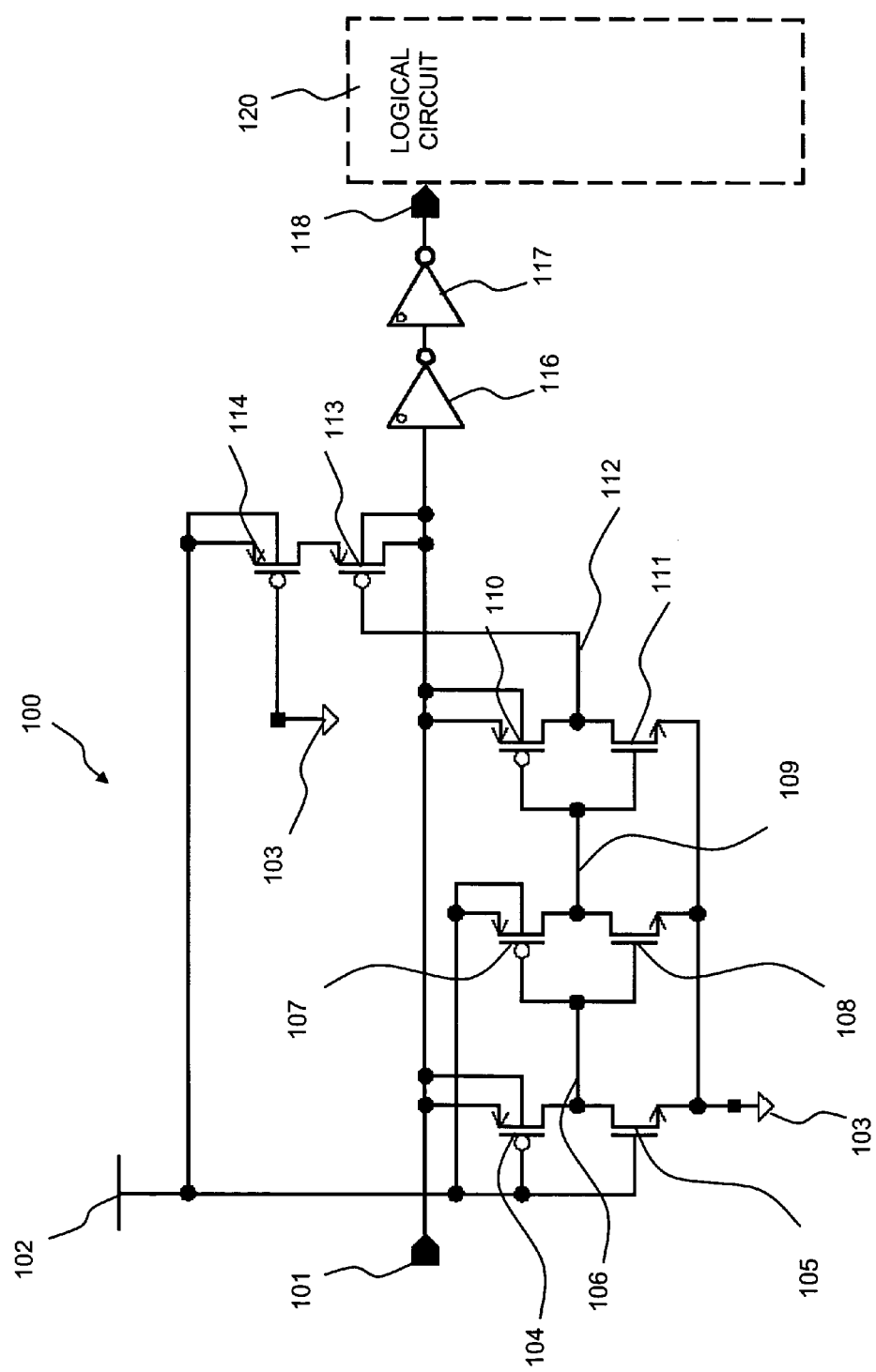
FIG. 1 illustrates an over-voltage tolerant input stage with pullup in accordance with an embodiment of the present invention.

FIG. 1 illustrates a multifunction input stage 100 in a semiconductor device. It is noted that, in this embodiment of the present invention, the exemplary semiconductor device is an electrically erasable programmable read-only memory (EEPROM). For this example the input stage 100 functions as both a data bit input and as a re-program enable input. In other embodiments, however, the over-voltage tolerant multifunction input stage can be implemented in a number of different semiconductor devices.

The over-voltage tolerant multifunction input stage illustrated in FIG. 1 is enabled to perform one function, such as a data bit input, at a logic-level voltage and another function, reprogramming enable for example, at a higher voltage level. It is noted that a typical logic level voltage for an EEPROM device can be 3.3V. A typical reprogram-enable voltage level is 12V. It is further noted that embodiments of the present invention are envisioned to provide over-voltage protection to input stages that are equipped with pullup transistors. The pullup transistors in these embodiments are enabled to switch off in the event of an over-voltage input, thus protecting supply voltage from being over powered by the input signal.

The input stage illustrated in FIG. 1 is connected to input pad 101. In this embodiment of the present invention, input pad 101 is a connection between a semiconductor chip and its architecture environment. In another embodiment, input pad 101 is a connection on a semiconductor chip between an EEPROM section and another functional section, both of which are resident on the same semiconductor device.

In one embodiment, input pad 101 is enabled to receive data from a data bus in the architecture environment. In another embodiment, input pad 101 is enabled to receive data from an address bus. In both of these and in other embodiments, input pad 101 is also enabled to receive a high-voltage signal that is intended to accomplish an additional function, such as a re-program enable in an EEPROM, for example.

The multifunction over-voltage tolerant input stage 100 has circuitry that is powered by $V_{dd}$ 102. As noted above, $V_{dd}$ in this embodiment of the present invention supplies 3.3 volts. In another embodiment, $V_{dd}$ is 1.8 volts. $V_{dd}$ 102 is shown in FIG. 1 as being coupled to the gates of MOSFETs 104 and 105, as well as to the source and bulk connections of PMOS 107 and PMOS 114. Though the connection is not shown for reasons of clarity, $V_{dd}$ 102 is also connected to, and powers, inverters 116 and 117.

Also shown in FIG. 1 are MOS transistors; PMOS 104, NMOS 105, PMOS 107, NMOS 108, PMOS 110, and NMOS 111. MOS transistors 104, 105, 107, 108, 110, and 111 are connected in complimentary MOS (CMOS) pairs, meaning that each NMOS is paired with a PMOS. PMOS 104 is paired with NMOS 105 in that their gate connections are common and are connected to $V_{dd}$ 102, as noted above. The drain of PMOS 104 is connected to the drain of NMOS 105 and the source of NMOS 105 is connected to ground 103. The connection between the PMOS 104 drain and the NMOS 105 drain is also connected to the gates of PMOS 107 and NMOS 108. It is noted that this connection scheme implements the complimentary pair, PMOS 104 and NMOS 105, as an inverter whose input is connected to $V_{dd}$ 102 and whose output, node 106, is connected to the input of the next complimentary pair, PMOS 107 and NMOS 108.

PMOS 107 and NMOS 108 are also implemented as an inverter. In this case, the inverter input is connected to the output 106 of the previous pair, PMOS 104 and NMOS 105, and whose output, node 109, is connected to the input of complimentary pair PMOS 110 and NMOS 111. However, whereas the source of PMOS 104 is connected to input pad 101, the source and bulk of PMOS 107 are connected to $V_{dd}$ 102.

PMOS 110 and NMOS 111 are implemented as a third inverter pair, with the drain of PMOS 110 connected to the drain of NMOS 111. The gates of PMOS 110 and NMOS 111 are connected to the output of the previous inverter pair, PMOS 107 and NMOS 108. This gate connection forms the input to the third inverter, node 109. The third inverter's output, node 112, is connected to the gate of PMOS 113. The source of PMOS 110 is connected to input pad 101. The source connections of NMOS 105, NMOS 108 and NMOS 111 are connected to ground 103.

PMOS 113 and PMOS 114 form a pullup circuit. The source and bulk connections of PMOS 114 are connected to $V_{dd}$ 102 and the drain and bulk connections of PMOS 113 are connected to input pad 101. The gate of PMOS 114 is connected to ground 103 and the gate of PMOS 113 is, as noted earlier, connected to the inverter output, node 112, of PMOS 110 and NMOS 111.

Inverters 116 and 117 are connected in series to input pad 101. This series connection provides buffering to the output 118 of the input stage. Output 118, in this embodiment, is a connection to an internal EEPROM data bus. In other embodiments, however, output 118 can be a connection to another logical circuit. As noted earlier, inverters 116 and 117 are connected to ground 103 and are connected, and powered by, $V_{dd}$ 102. The connections of inverting buffers 116 and 117 to $V_{dd}$ 102 and to ground 103 are not shown in FIG. 1 for reasons of clarity.

In the present embodiment, PMOS 104, NMOS 105, PMOS 107, NMOS 108, PMOS 110, and NMOS 111 form a switching circuit. The switching circuit is able to control the operation of the pullup circuit.

In operation, an input signal is received at input pad 101 and is either sent on to output 118 or limited if the input signal is a high voltage signal. In the present embodiment, a normal logic signal is on the order of 0.0 to 3.3 volts. In another embodiment, the normal range is 0.0 to 1.8 volts. Output pad 118, in this embodiment, only receives voltages between 0.0 and $V_{dd}$ because of the buffering provided by inverters 116 and 117. In other embodiments, other voltages can be sent to output pad 118.

When a signal is received at input pad 101 that is a logical "0", e.g., at or near a ground level of 0.0 volts, the gate-source voltage ($V_{GS}$) of PMOS 104 is positive with respect to the drain-source voltage ($V_{DS}$) which keeps PMOS 104 non-conducting between the drain and source. The gate-source voltage ($V_{GS}$) of NMOS 105 is also positive which makes NMOS 105 conductive. This conductivity pulls node 106 to ground level of zero volts.

With node 106 at or near 0.0 volts, the gate-source voltage ($V_{GS}$) of PMOS 107 is negative. This allows PMOS 107 to be conducting between the drain and source, raising node 109 to the voltage level of $V_{dd}$ 102. The gate-source voltage ($V_{GS}$) of NMOS 108 is zero which keeps NMOS 105 non-conducting. With node 109 isolated from ground 103 and connected to $V_{dd}$ 102 by PMOS 107, node 109 is held high, at or near $V_{dd}$.

With node 109 held high, the input to the third inverting pair, PMOS 110 and NMOS 111, is high. The gate-source voltage ($V_{GS}$) of PMOS 110 is therefore positive as it is for any input voltage between zero and $V_{dd}$, which keeps PMOS 110 non-conducting between the drain and source. The gate-source voltage ($V_{GS}$) of NMOS 111 is also positive which makes NMOS 111 conductive. This conductivity pulls node 112 to ground level, zero volts.

Node 112, in this embodiment, is connected to the gate of PMOS 113. The gate of PMOS 114 is connected to ground 103 and, as noted previously, the source and bulk connections of PMOS 114 are connected to $V_{dd}$ 102. The source of PMOS 113 is connected to the drain of PMOS 114. When the voltage at node 112 is near zero, the gate-source voltage of PMOS 113 is negative, allowing PMOS 113 to conduct. The drain connection of PMOS 113, which is connected to input pad 101, is then pulled up to the level of $V_{dd}$ 102.

It is noted that the bulk and drain connections of PMOS 113 are both connected to input pad 101. The bulk and source connections of PMOS 114 are connected to $V_{dd}$ 102 and the gate connection is connected to ground 103. With the bulk connections tied in this manner, the inherent diode p-n junctions of PMOS 113 and PMOS 114 are kept in a reverse bias state. With the gate of PMOS 114 connected to ground 103, the gate-source voltage of PMOS 114 is always held negative. Thus PMOS 114 serves to limit current flow between $V_{dd}$ 102 and input pad 101, controlling the pullup action of PMOS 113.

In this embodiment of the present invention, buffering of the input signal is provided by inverting buffers 116 and 117. When input pad 101 receives a low logic-level voltage signal, the output at output connection 118 is taken to ground level, zero volts. When a high voltage signal is received at input pad 101, whether it is a logic-level high or a higher voltage, the output signal at output connection 118 is near $V_{dd}$ supply voltage, 102. In one embodiment of the present invention, an EEPROM re-program enable voltage of 12 volts can be received at input pad 101. However, the signal voltage at output connection 118 does not exceed that of $V_{dd}$ 102. $V_{dd}$ in this embodiment is 3.3 volts. It is noted that an input signal that has a logic-level voltage can be addressing data, content data, or other usable logic-level signals. A high voltage input signal is noted to be one having an alternative purpose, such as enabling a reprogramming of an EEPROM, for example.

Referring still to FIG. 1, when a signal is received at input pad 101 that is a logical "1", such as a voltage level at or near $V_{dd}$, 3.3 volts for example, the gate-source voltage ($V_{GS}$) of PMOS 104 is near zero ($V_G=V_{dd}$, $V_S=V_{dd}$). Again, PMOS 104 remains in a non-conducting state between the drain and source. The gate-source voltage ($V_{GS}$) of NMOS 105 is also positive which keeps NMOS 105 conductive. This conductivity pulls node 106 to ground, 0.0V.

When node 106 is at or near 0.0 volts, the gate-source voltage ($V_{GS}$) of PMOS 107 is negative. This allows PMOS 107 to be conducting between the drain and source, connecting node 109 to the voltage level of $V_{dd}$ 102. The gate-source voltage ($V_{GS}$) of NMOS 108 is near zero which keeps NMOS 105 non-conducting. With node 109 isolated from ground 103 and connected to $V_{dd}$ 102 by PMOS 107, node 109 is held high, near $V_{dd}$.

Again, with node 109 held high, the input to the third inverting pair, PMOS 110 and NMOS 111, is high. The gate-source voltage ($V_{GS}$) of PMOS 110 is therefore near zero ($V_{dd}$-input signal voltage $V_{SIG}$), which keeps PMOS 110 non-conducting between the drain and source. The gate-source voltage ($V_{GS}$) of NMOS 111 is also positive which makes NMOS 105 conductive. This conductivity pulls node 112 to ground voltage level, 0.0V.

Because node 112 is connected to the gate of PMOS 113, the gate of PMOS 113 is kept low and PMOS 113 remains conductive. Because the gate of PMOS 114 is connected to ground 103, PMOS 114 is also conductive, providing current limitation to the pullup action of PMOS 113. Thus, the voltage level of input pad 101 is pulled to the level of $V_{dd}$ 102.

Referring still to FIG. 1, a high voltage signal can also be accommodated at input pad 101. It is noted that a high voltage signal is a signal whose voltage level is greater than the level of $V_{dd}$. In the present embodiment, $V_{dd}$ is nominally 3.3 volts and a high voltage is greater than 3.3 volts. For purposes of example, a high voltage of 12 volts is used. In another embodiment, a different $V_{dd}$, 1.8 volts for example, is used. In yet another embodiment, a different high voltage signal is received at the input pad.

In one embodiment of the present invention, over-voltage tolerant input stage 100 is implemented in an EEPROM device. Input pad 101 can, in this embodiment, act as both a data input pad and as a re-program enable pin, providing multiple functions for a single input pad. In the case of a re-program enable signal, input pad 101 can receive a signal of a voltage level near 12 volts.

Referring still to FIG. 1, when a signal is received at input pad 101 that is at a voltage level higher than $V_{dd}$, such as 12 volts for example, the gate-source voltage ($V_{GS}$) of PMOS 104 is negative ($V_{dd}$-$V_{SIG}$). PMOS 104 is thus brought to a conducting state between the drain and source which brings node 106 up to the level of input pad 101. The gate-source voltage ($V_{GS}$) of NMOS 105 remains positive which keeps NMOS 105 conductive, tying node 106 to ground 103. However, due to the relative strengths of PMOS 104 and NMOS 105, discussed in further detail below in reference to FIG. 2, node 106 reaches a high value before it can be drawn down to ground level. Node 106 is thus pulled to the level of the input signal at input pad 101, which is 12V in this example.

When node 106 is high, such as at or near 12 volts as in the present example, the gate-source voltage ($V_{GS}$) of PMOS 107 is positive ($V_{SIG}$-$V_{dd}$). This makes PMOS 107 non-conducting between the drain and source, isolating node 109 from the voltage level of $V_{dd}$ 102. The gate-source voltage ($V_{GS}$) of NMOS 108 is positive which makes NMOS 108 conducting. With node 109 isolated from $V_{dd}$ 102 by PMOS 107 and connected to ground 103 by NMOS 108, node 109 is brought low, to zero volts.

With node 109 held low, the input to the third inverting pair, PMOS 110 and NMOS 111, is low. The gate-source voltage ($V_{GS}$) of PMOS 110 is therefore negative (0-$V_{SIG}$), which makes PMOS 110 conducting between the drain and source, and connects node 112 to input pad 101. The gate-source voltage ($V_{GS}$) of NMOS 111 is also negative which makes NMOS 105 non-conductive, isolating node 112 from ground 103. This conductivity pulls node 112 to the level of the signal at input pad 101, which is 12 volts in this example.

Since node 112 is connected to the gate of PMOS 113, PMOS 113 is made non-conductive. Because the gate of PMOS 114 is connected to ground 103, PMOS 114 remains conductive, pulling the source of PMOS 113 to $V_{dd}$. However, since PMOS 113 is not in a conductive state, the high voltage at input pad 101 is isolated from $V_{dd}$ 102.

In this manner, over-voltage tolerant multifunction input stage 100 is enabled to tolerate high voltage input signals ($V_{SIG}$) and also provide a buffered input to a device with a pullup capability. It is noted again that this embodiment of input stage 100 is implemented in an EEPROM device. In another embodiment, input stage 100 is implemented in another type of semiconductor device.

In this embodiment of the present invention, PMOS 113 is made non-conductive rapidly in order to prevent a high voltage from overpowering the supply voltage, $V_{dd}$ at 102. PMOS 113 is made non-conductive at an input signal voltage ($V_{SIG}$) that is at a relatively small increment above $V_{dd}$ 102.

It is noted here that, in the present embodiment, PMOS 104 and NMOS 105 are configured as an inverting CMOS pair. In a CMOS inverter, the combination of a relatively weak NMOS with a relatively strong PMOS results in a shift of the relationship of the output voltage $V_{OUT}$ to the input voltage $V_{IN}$. It is further noted that, in an idealized CMOS inverter pair, the input voltage at the transition point, or threshold voltage, the point of relatively rapid changeover from a high $V_{OUT}$ to a low $V_{OUT}$ as $V_{IN}$ increases or from a low $V_{OUT}$ to a high $V_{OUT}$ as $V_{IN}$ decreases, is referred to as $V_M$. Shifting the balance of strengths between the NMOS and the PMOS results in a shift of transition voltage, $V_M$. The pairing of a weak PMOS with a strong NMOS results in a shift of $V_M$ to a higher input voltage ($V_{IN}$). The pairing of a strong PMOS with a weak NMOS results in a shift of $V_M$ to a lower input voltage.

To enable making PMOS 113 non-conductive at only a small input signal voltage $V_{SIG}$ above $V_{dd}$, NMOS 105 must be "weak" and PMOS 104 must be "strong". It is also noted here that "weak" and "strong" refer to the characteristics of MOS transistors. A "strong" NMOS transistor is characterized by a relatively large increase in drain current for a relatively small gate-source voltage. A "weak" NMOS transistor is characterized by a relatively small increase in drain current for a relatively large gate-source voltage. Conversely, a "strong" PMOS transistor is characterized by a relatively large decrease in drain current for a relatively small gate-source voltage. A "weak" PMOS transistor is characterized by a relatively small decrease in drain current for a relatively large gate-source voltage. Typically, a weak MOS transistor is constructed with a relatively small channel width and/or a long channel length and a strong MOS transistor is constructed with a relatively large channel width and/or a short channel length.

It is noted here that embodiments of the present invention are enabled to compare the voltage of an input signal to a supply voltage, $V_{dd}$, 102. Other embodiments of the present invention are enabled to compare the voltage level of the input signal with another reference voltage.

Figure 2:
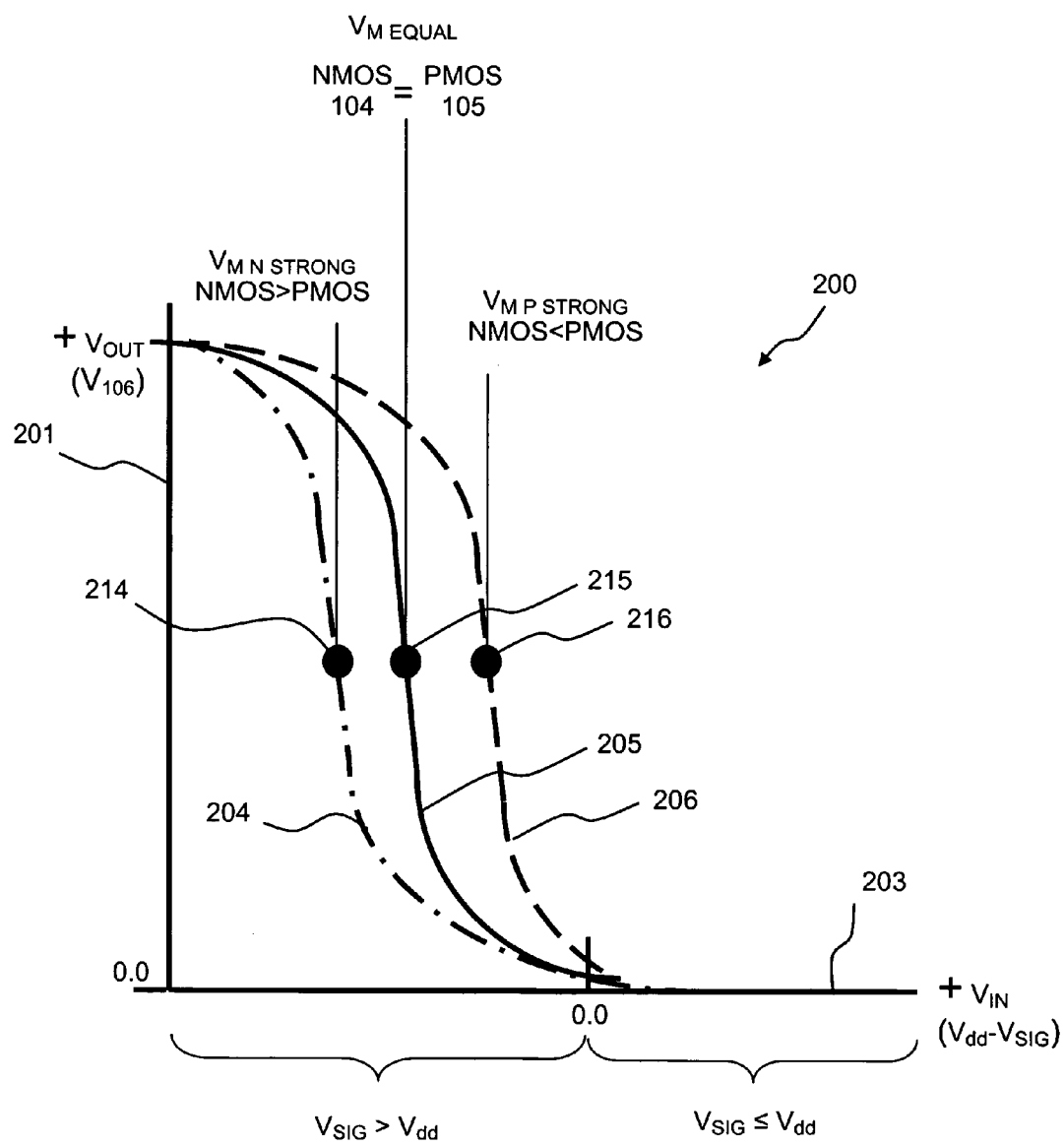
FIG. 2 illustrates a curve showing the behavior of a CMOS inverter in accordance with an embodiment of the present invention.

FIG. 2 is a graph illustrating the characteristics of an inverting CMOS pair. Graph 200 presents the input voltage ($V_{IN}$) on the abscissa (X-axis) 203 and output voltage ($V_{OUT}$) on the ordinate (y-axis) 201. Referring also to FIG. 1, in one embodiment of the present invention, the input voltage ($V_{IN}$) is the gate voltage of PMOS 104 and NMOS 105, as compared to the source voltage of PMOS 104 and the output voltage ($V_{OUT}$) is the voltage at node 106 ($V_{106}$). In this embodiment, the input voltage comparison is the difference between $V_{dd}$ 102 and the input signal voltage level $V_{SIG}$ at input pad 101. The $V_{IN}$ to the inverter, measured on abscissa 203, as characterized in graph 200 is then $V_{dd}$-$V_{SIG}$. In this embodiment, when the voltage of the input signal, $V_{SIG}$, to input pad 101 is equal to or less than $V_{dd}$, $V_{IN}$ is zero or positive. When $V_{SIG}$ is greater than $V_{dd}$, $V_{IN}$ is negative. In graph 200, the transition voltage ($V_M$) indicates the input voltage at which the output voltage changes from zero to positive or from positive to zero.

It is noted here that, in an idealized inverter, for all positive input voltages the output voltage is negative. For all negative input voltages, output voltage is positive. In an actual inverter, a difference in strength between the PMOS and NMOS transistors in a CMOS inverter pair can skew the inverse relationship in one direction or another.

In an embodiment of the present invention such as is shown in FIG. 1, the pullup transistor, PMOS 113, becomes non-conducting to isolate $V_{dd}$ 102 from a high voltage on input pad 101. In order to protect $V_{dd}$ 102 and devices connected to it from damage due to a high voltage input, PMOS 113 must turn off quickly, as soon as practicable upon input voltages only slightly higher than logic level voltage. However, if PMOS 113 were to switch off on an input voltage equal to a logical high, each logical high signal would be treated as a high voltage signal. A balance of a strong PMOS and a weak NMOS in the CMOS pair results, in this embodiment of the present invention, in a turning off of PMOS 113 at an input signal voltage slightly above but not equal to $V_{dd}$. This relationship is illustrated in graph 200 of FIG. 2.

In graph 200, a transition curve is shown for three different relationships between the NMOS and PMOS transistors of a CMOS inverter. Curve 205 of graph 200 illustrates the behavior of $V_{OUT}$ for an inverter featuring an NMOS and PMOS of relatively equal strengths. In this nearly ideal inverter, transition voltage $V_{M\ EQUAL}$ 215 equates to an input $V_{IN}$ somewhat larger than $V_{dd}$.

Referring still to FIG. 2 and FIG. 1, curve 204 illustrates a transition between high and low outputs for an inverter featuring a relatively weak PMOS and a relatively strong NMOS. As $V_{IN}$ 203 decreases from zero, $V_{OUT}$ 201 transitions from a high to a low value at $V_{M\ N\ STRONG}$ 214, a negative value for $V_{IN}$. $V_{M\ N\ STRONG}$ 214 represents a relatively high value of input signal voltage $V_{SIG}$.

Again referring to FIG. 2 and FIG. 1, curve 206 of graph 200 illustrates a threshold voltage for a pairing of a moderately strong PMOS and a relatively weak NMOS in the CMOS pair. The transition voltage $V_{M\ P\ STRONG}$ for curve 206 represents an input signal voltage slightly greater than $V_{dd}$. In FIG. 1, curve 206 equates to the behavior of the voltage at node 106 with the implementation of a moderately strong PMOS 104 with a relatively weak NMOS 105 in the first CMOS inverter. In this embodiment, $V_{M\ P\ STRONG}$ 216 occurs at an input signal voltage $V_{IN}$ that is slightly greater than that of $V_{dd}$ 102.

In the present embodiment, during normal operations in which data-level voltages are sensed at input pad 101, the gate voltage of PMOS 104 and NMOS is always at $V_{dd}$ 102. When a high voltage signal is first received at input pad 101, the gate-source voltage $V_{GS}$ of NMOS 105 is $V_{dd}$-ground, or $V_{dd}$, meaning that node 106 is tied to ground 103, or 0.0 volts. Again it is noted that $V_{dd}$ in the present embodiment is 3.3 volts by way of example.

When the input signal voltage level sensed at input 101 is a logical high, equal to $V_{dd}$ 102, gate-source voltage ($V_{GS}$) of PMOS 104, which is equal to $V_{dd}$-$V_{SIG}$, approaches zero. However, for PMOS 104 to begin conducting, the gate-source voltage ($V_{GS}$) of PMOS 104 must become negative by the input signal voltage $V_{SIG}$ exceeding $V_{dd}$ ($V_{GS}$=$V_{dd}$-$V_{SIG}$). Since PMOS 104 is relatively strong, a relatively small increase in $V_{SIG}$ over $V_{dd}$ results in making PMOS 104 conductive, raising $V_{106}$ above ground level, $V_{GND}$. Because the gate of NMOS 105 is tied to $V_{dd}$, the relatively weak NMOS 105 continues to conduct, tying node 106 to ground. However, because NMOS 105 is weak relative to PMOS 104, the inverting pair's output voltage, $V_{106}$, is raised to the level of $V_{SIG}$ as sensed at input pad 101.

In the present embodiment, a relationship of a PMOS 104 strength of approximately 30 times that of NMOS 105 achieves a relatively rapid transition of $V_{106}$ from low to high. As discussed above in reference to FIG. 1, a high voltage at node 106 ultimately results in making PMOS 113 non-conductive, thus isolating $V_{dd}$ 102 from a high $V_{SIG}$ sensed at input pad 101. It is the rapid transition of PMOS 113, in the present embodiment, that ensures protection of $V_{dd}$ 102 from an over-voltage input signal.

In another embodiment of the present invention, the strength ratios of PMOS to NMOS in the inverting CMOS pair exemplified by PMOS 104 and NMOS 105 can be different. In this embodiment, the ratio can be lower, on the order of 10 to 1. In yet another embodiment, the strength ratio can be as high as 50 to 1.

Figure 3:
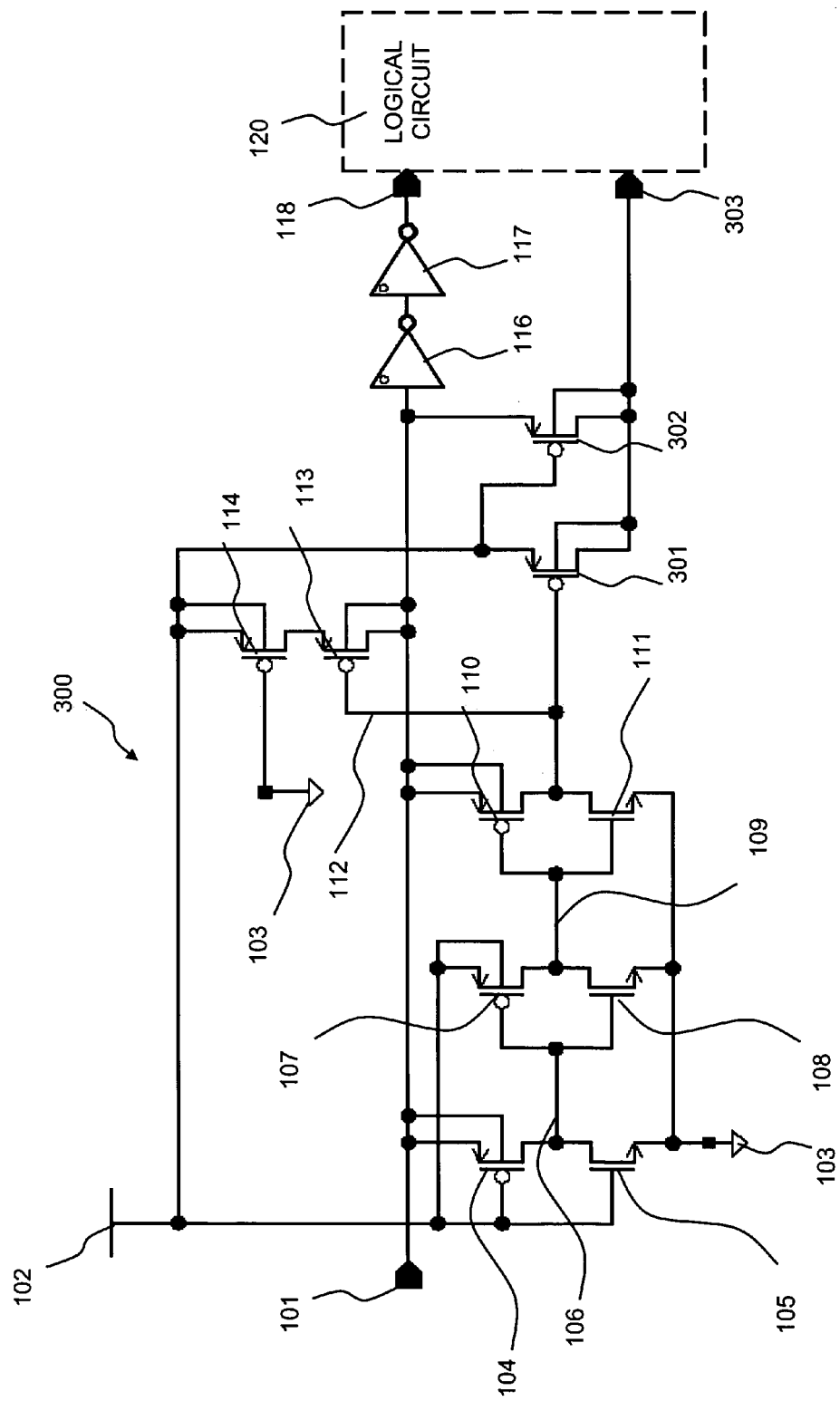
FIG. 3 illustrates a multifunction over-voltage tolerant input stage with pullup and high voltage output in accordance with an embodiment of the present invention.

FIG. 3 illustrates an embodiment of the present invention in which a switching high-voltage output is implemented. Here, multifunction over-voltage tolerant input stage 300 is similar to multifunction over-voltage tolerant input stage 100, with the addition of a high voltage output circuit formed by PMOS 301, PMOS 302, and high voltage output connection 303.

In multifunction, over-voltage tolerant, input stage 300, the source of PMOS 301 is connected to $V_{dd}$ 102, its gate is connected to node 112, and its drain is connected to high voltage output pad 303. The source of PMOS 302 is connected to input pad 101, its gate is connected to $V_{dd}$ 102, and its drain, like that of PMOS 301, is connected to high voltage output pad 303.

In this embodiment, when the voltage level of the signal received at input pad 101 is anything below $V_{dd}$, for example between 0.0 and 3.3 volts, node 112 is pulled low, to ground level voltage as discussed above. When node 112 is low, the gate-source voltage ($V_{GS}$) of PMOS 301 is negative, making PMOS 301 conductive. High voltage output pad 303 is thereby connected to, and outputs, the voltage level of $V_{dd}$ 102. In this case, the gate-source voltage ($V_{GS}$) of PMOS 302 is positive with respect to the drain-source voltage ($V_{DS}$), making PMOS 302 non-conductive and thereby isolating the signal at input pad 101 from high voltage output pad 303.

When the voltage level of the signal received at input pad 101 is higher than $V_{dd}$, for example 12 volts, node 112 is pulled high, to the signal level voltage, as discussed above. When node 112 is higher than $V_{dd}$, the gate-source voltage ($V_{GS}$) of PMOS 301 is positive, making PMOS 301 non-conductive. High voltage output pad 303 is isolated from $V_{dd}$ 102 by PMOS 301. In this case, the gate-source voltage ($V_{GS}$) of PMOS 302 is negative, making PMOS 302 conductive and thereby connecting the signal at input pad 101 to the high voltage output pad 303.

This selection action of PMOS 301 and PMOS 302 acts to send the higher voltage of either $V_{dd}$ or the input signal to high voltage output 303. $V_{dd}$ is connected to high voltage output 303 in the case of an input signal of any voltage at or below $V_{dd}$ and the high voltage signal is connected to high voltage output 303 in the case of an input signal of any voltage higher than $V_{dd}$.

Figure 4:
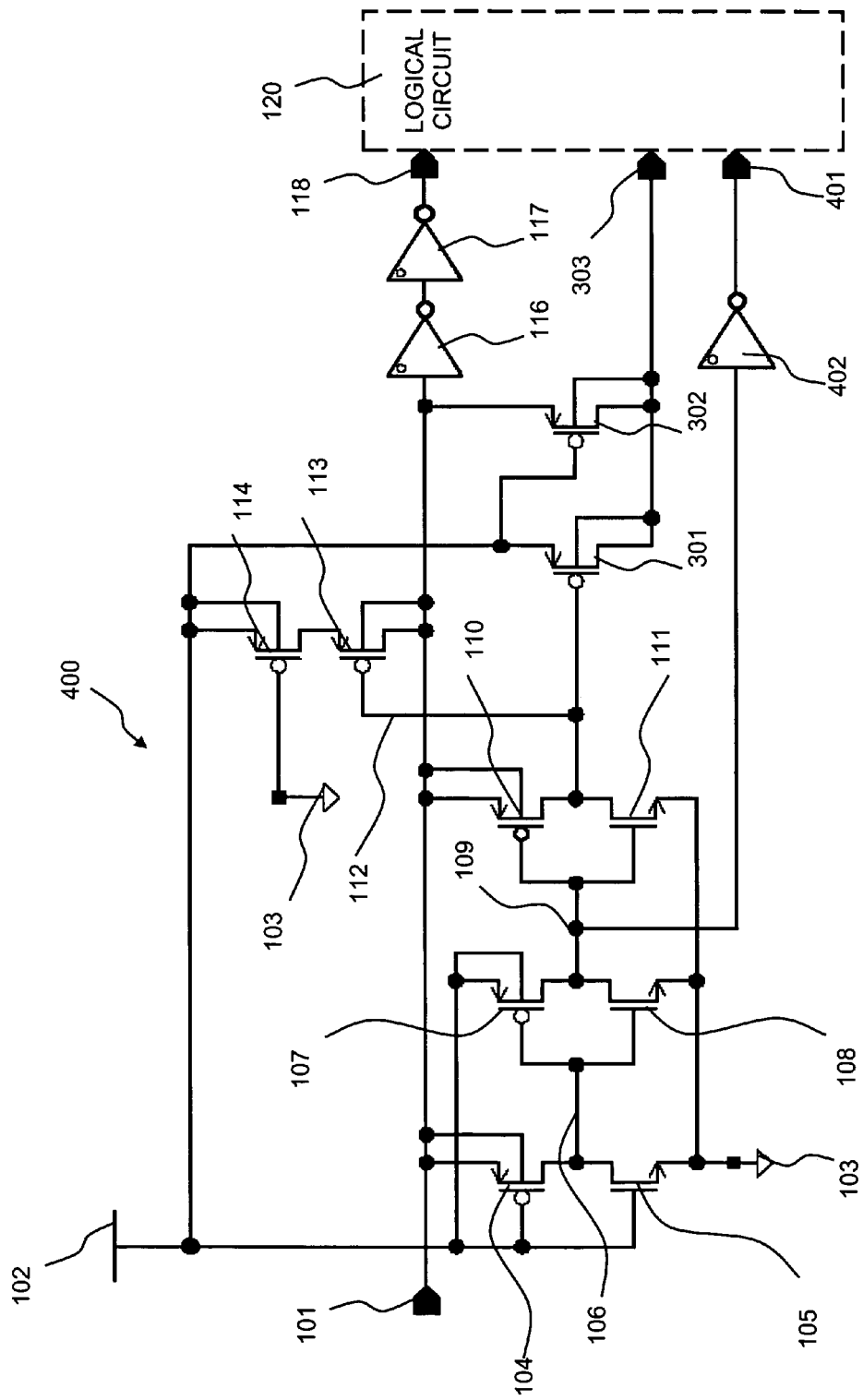
FIG. 4 illustrates a multifunction over-voltage tolerant input stage with pullup, high voltage output, and high-voltage-signal-received logic in accordance with an embodiment of the present invention.

FIG. 4 illustrates multifunction over-voltage tolerant input stage 400. Input stage 400 is similar to multifunction over-voltage tolerant input stage 300 with the addition of inverting buffer 402 and high-voltage-signal-received logic output 401. Multifunction over-voltage tolerant input stage 400 functions identically to multifunction over-voltage tolerant input stage 300 with the exception that, when a high voltage signal is received at input pad 101, a logic level "1" voltage is output at high voltage signal received flag output 401.

High voltage signal received flag output 401 is connected to node 109 by inverting buffer 402. Referring to the previous discussion above in reference to FIG. 1, node 109 is held high, resulting in a low state at output 401, for all input signals whose voltage levels are at or below $V_{dd}$. By way of example, in the present embodiment, $V_{dd}$ is 3.3 volts. In another embodiment, $V_{dd}$ is 1.8 volts. It is noted that neither the specific voltage level of $V_{dd}$ nor the specific level of the input signal received at input pad 101 change the function of multifunction over-voltage tolerant input stage 400.

In one embodiment of the present invention, high-voltage-signal-received logic output 401 is used to inform a logical circuit of the arrival of a high voltage signal. In another embodiment, the high-voltage-signal-received logic output 401 is used to provide a "received" indication to the sender of the high voltage signal. In yet another embodiment, high-voltage-signal-received logic output 401 is used for other purposes.

Figure 5:
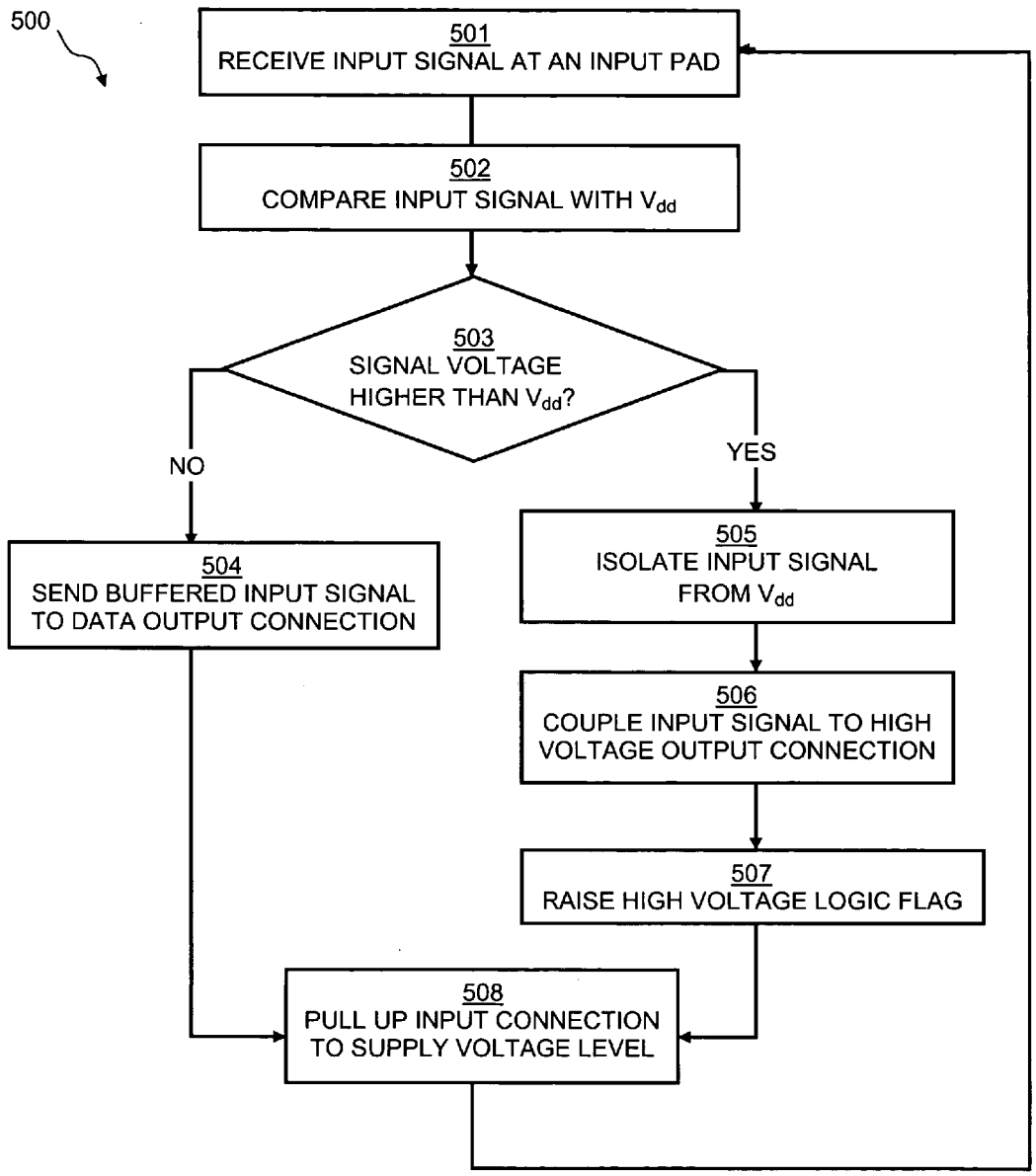
FIG. 5 illustrates a flow chart of a method for providing over-voltage protection to an input stage in accordance with an embodiment of the present invention.

FIG. 5 illustrates a flow chart of a method for providing over-voltage protection to an input stage in a semiconductor device. In this embodiment, a method for over-voltage protection on a multifunction input stage is implemented, with input pad pull-up capability, in an EEPROM device. In another embodiment, the method is implemented in another semiconductor device.

Method 500 commences by receiving an input signal, 501. An input signal can be a data input or, as in this embodiment, a command signal such as a re-program enable in an EEPROM device. An input data signal can be a logical "1" or logical "0", ranging from ground level to $V_{dd}$. An input can also be of a much higher level if it is a command input. An example of a command level voltage is 12 volts, a common level for a re-program input in an EEPROM.

The input signal is compared to a reference voltage at 502. In the present embodiment, the reference voltage is power supply voltage, $V_{dd}$. In an implementation of an embodiment of the present invention, the comparison is accomplished by an inverting pair of CMOS transistors. In the implementation of the present embodiment illustrated in FIGS. 1, 3 and 4, the comparison is accomplished by a comparator function of the switching circuit constructed of the set of three inverters formed by PMOS 104, NMOS 105, PMOS 107, NMOS 108, PMOS 110, and NMOS 111. In another implementation, the comparison is accomplished by a different implementation of a comparator.

Referring to step 503, if the voltage of the input signal is less than or equal to $V_{dd}$, the buffered input signal is sent, or connected, to a data output connection 504. A data output connection can be a connection within a semiconductor device or it can be an output pad to connect to another device. In the implementation of this embodiment illustrated in FIGS. 1, 3 and 4, the input signal received at input pad 101 is conducted to the input of inverter 116 which sends the inverted signal to inverter 117. Inverter 117 then sends the inverted signal from inverter 116, itself an inverted signal, to output connection 118. In this manner, output connection 118 sends either a logical low or a logical high voltage level, implementing a buffered output signal that is referenced to the input signal received at input pad 101.

If, in step 503, the input signal voltage level is above that of $V_{dd}$ supply voltage, the input signal voltage is isolated from $V_{dd}$ supply voltage 505 and is coupled to a high voltage output connection 506. In an implementation of the present embodiment illustrated in FIGS. 3 and 4, the isolation is accomplished by sending a logical high voltage at node 112 to the gate of pullup PMOS 113. PMOS 113 is then non-conductive and the input signal is isolated from $V_{dd}$ 102. The coupling to a high voltage output connection 506, in that implementation, is accomplished making PMOS 302 conductive, as described in reference to FIGS. 3 and 4 above. This couples input pad 101 to high voltage output connection 303.

In one implementation of embodiments of the present invention, after the high voltage signal is sent to a high voltage output, a high voltage flag is raised 507. The high voltage flag, in this implementation, is another output that is set to a different voltage level. In the implementation of the embodiment of the present invention illustrated in FIG. 4, high voltage logic output 401 is normally held low by inverter 402 and its input connection from node 109. When a high voltage input is sensed at input pad 101, node 109 is pulled low by the circuit logic described in reference to FIGS. 1, 3 and 4. This low voltage state at node 109, the input to inverter 402, results in a high logic state at logic output 401 which constitutes a raised logic flag.

After coupling to an output connection, whether the signal received is a logical high or a logical low, the input pad is returned to a waiting state, 508. In one implementation, returning is accomplished by pulling the voltage level of input pad 101 to $V_{dd}$ voltage level to prevent its floating. The pull-up can be accomplished by a pull-up transistor or by a different circuit implementation. In one implementation, the pull-up is accomplished by a pair of PMOS transistors in series. One of the PMOS transistors is controlled by the comparator discussed above and the other is implemented as a current limiter. Once the input pad is pulled to $V_{dd}$ level, the input pad is ready to receive another input signal, 501.

After the high voltage signal is sent to the high voltage output and the high voltage signal logic output is raised, the input connection is again pulled to the supply voltage 508, $V_{dd}$ in this example, and a new input can be accommodated 501. In the implementation of method 500 in embodiments of the present invention as illustrated in FIGS. 1, 3, and 4, when the high voltage signal is no longer present at the input pad 101, input pad 101 is pulled back to $V_{dd}$ by the pullup circuit as described in reference to those figures. Input pad 101 is then ready to receive further data or high voltage inputs.

A novel over-voltage tolerant input stage in a semiconductor device has been disclosed. The input stage comprises: an input pad for receiving an input signal to the semiconductor device, a buffer coupled to the input pad for buffering the input signal, a pullup circuit coupled to the input pad for limiting current in the input signal, a switching circuit coupled to the input pad for controlling the pullup circuit, and a voltage supply coupled to the input pad, the pullup circuit and the switching circuit, wherein the switching circuit is enabled to turn the pullup circuit off to isolate the input signal from the supply voltage in the event of an over-voltage condition.

Embodiments of the present invention provide a circuit and method for accommodating a multifunction input to a semiconductor chip that is tolerant to a high voltage, input on the same input pad that responds to logic level voltages. Relatively small logic level voltages attendant to normal functions of the device, such as data handling or supply voltage, are not overpowered by the relatively high current of the high voltage input.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. In a semiconductor device, an input stage comprising:
   a pad for receiving an input signal to said semiconductor device;
   a buffer coupled to said input pad for buffering said input signal;
   a pullup circuit coupled to said input pad;
   a voltage supply coupled to said pullup circuit;
   a switching circuit coupled to said voltage supply and coupled to said input pad for controlling said pullup circuit, said switching circuit including a set of three inverters electrically coupled so that the output of said set of three inverters is coupled to the gate of a transistor in said pullup circuit, said set of three inverters including a first inverter powered by said input signal, a second inverter powered by said voltage supply and a third inverter powered by said input signal, said switching circuit enabled to cause said pullup circuit to stop current flow between said input signal and said voltage supply in the event of an over-voltage condition at said input pad.

2. The input stage described in claim 1 wherein each of said inverters comprises a CMOS pair of transistors.

3. In a semiconductor device, an input stage comprising:
   a pad for receiving an input signal to said semiconductor device;
   a buffer coupled to said input pad for buffering said input signal;
   a pullup circuit coupled to said input pad;
   a voltage supply coupled to said pullup circuit;
   a switching circuit coupled to said voltage supply and coupled to said input pad for controlling said pullup circuit, said switching circuit including a set of three inverters electrically coupled so that the output of said set of three inverters is coupled to the gate of a transistor in said pullup circuit, each of said inverters including a CMOS pair of transistors, a first of said CMOS pairs of transistors including an NMOS transistor and a PMOS transistor that is stronger than said NMOS transistor, said switching circuit enabled to cause said pullup circuit to stop current flow between said input signal and said voltage supply in the event of an over-voltage condition at said input pad.

4. The input stage described in claim 3 wherein said set of inverters acts to compare said input signal to said voltage supply.

5. The input stage described in claim 3 further comprising a high voltage output circuit comprising a high voltage output connection, said high voltage output circuit coupled to said switching circuit, to said voltage supply and to said input pad.

6. In a semiconductor device, an input stage comprising:
   a pad for receiving an input signal to said semiconductor device;
   a buffer coupled to said input pad for buffering said input signal;
   a pullup circuit coupled to said input pad;
   a voltage supply coupled to said pullup circuit;
   a switching circuit coupled to said voltage supply and coupled to said input pad for controlling said pullup circuit, said switching circuit including a set of three inverters electrically coupled so that the output of said set of three inverters is coupled to the gate of a transistor in said pullup circuit, said switching circuit enabled to cause said pullup circuit to stop current flow between said input signal and said voltage supply in the event of an over-voltage condition at said input pad; and
   a high voltage output circuit that is coupled to said input pad, said voltage supply and said switching circuit, said high voltage output circuit including a high voltage output connection and a first transistor enabled to isolate said high voltage output connection from said voltage supply.

7. The input stage described in claim 6 wherein said high voltage output circuit comprises a second transistor enabled to couple said input signal to said high voltage output connection.

8. The input stage described in claim 6 wherein said first transistor is controlled by an output of said switching circuit.

9. The input stage described in claim 6 further comprising an inverting buffer and a high-voltage-signal-received logic output connection that is electrically coupled to the output of said inverting buffer, the input of said inverting buffer coupled to said switching circuit and the output of said inverting buffer coupled to said high-voltage-signal-received logic output connection.

10. A semiconductor device, comprising:
   a logical circuit; and
   an input connection coupled to said logical circuit, wherein said input connection is coupled to a multifunction input stage enabled to isolate an input signal that is greater than a reference voltage, said multifunction input stage including a pullup circuit electrically coupled to said input connection and a switching circuit coupled to said input connection, said switching circuit including a set of three inverters electrically coupled so that the output of said set of three inverters is coupled to the gate of a transistor in said pullup circuit, each of said inverters including a CMOS pair of transistors, a first of said CMOS pairs of transistors including an NMOS transistor and a PMOS transistor that is stronger than said NMOS transistor.

11. The semiconductor device described in claim 10, wherein said input stage is enabled to pullup the voltage level of said input connection.

12. The semiconductor device described in claim 10, wherein said logical circuit comprises an electrically erasable programmable read-only memory.

13. The semiconductor device described in claim 12, wherein said input stage is enabled to receive data at a logic-level voltage.

14. The semiconductor device described in claim 12, wherein said input stage is enabled to receive a high voltage input signal.

15. The semiconductor device described in claim 14, wherein said high voltage input signal comprises control logic for said electrically erasable programmable read-only memory circuit.

16. The semiconductor device described in claim 10, wherein said input stage is enabled to raise a logic flag upon receiving a high voltage signal.

* * * * *